(12) United States Patent
Wadley

(10) Patent No.: US 6,675,334 B2
(45) Date of Patent: Jan. 6, 2004

(54) APPARATUS AND METHOD FOR MULTI-CYCLE MEMORY ACCESS MAPPED TO JTAG FINITE STATE MACHINE WITH EXTERNAL FLAG FOR HARDWARE EMULATION

(75) Inventor: John K. Wadley, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 380 days.

(21) Appl. No.: 09/870,817

(22) Filed: May 31, 2001

(65) Prior Publication Data

US 2002/0184585 A1 Dec. 5, 2002

(51) Int. Cl.⁷ ........................ G01R 31/28; G06F 11/00
(52) U.S. Cl. ............................... 714/727; 714/29
(58) Field of Search .................... 714/727, 29

(56) References Cited

U.S. PATENT DOCUMENTS

| | | | | |
|---|---|---|---|---|
| 4,302,775 A | * | 11/1981 | Widergren et al. | 375/240.06 |
| 5,121,390 A | * | 6/1992 | Farrell et al. | 370/458 |
| 5,590,304 A | * | 12/1996 | Adkisson | 711/100 |
| 5,905,738 A | | 5/1999 | Whetsel | 371/22.4 |

OTHER PUBLICATIONS

"IEEE Standard Test Access Port and Boundary–Scan Architecture" IEEE Std. 1149.1–1990, May 21, 1990.

* cited by examiner

Primary Examiner—Phung M. Chung
Assistant Examiner—Joseph D. Torres
(74) Attorney, Agent, or Firm—J. Dennis Moore; W. James Brady, III; Frederick J. Telecky, Jr.

(57) ABSTRACT

A circuit comprising a data input and output, a memory interface, a programmable counter, a signal line, and a test circuit further comprising an instruction register and at least one data register for supporting testing and emulating a memory subsystem with different types of physical memory in a microprocessor based system.

18 Claims, 3 Drawing Sheets

APPARATUS AND METHOD FOR MULTI-CYCLE MEMORY ACCESS MAPPED TO JTAG FINITE STATE MACHINE WITH EXTERNAL FLAG FOR HARDWARE EMULATION

FIELD OF THE INVENTION

This invention relates generally to digital circuit design in a test and emulation environment and more particularly to reducing hardware complexity and inefficiency in supporting a memory subsystem with memories of differing speeds by using a programmable counter to support memory accesses.

BACKGROUND OF THE INVENTION

A memory subsystem of a microprocessor based system is usually comprised of more than a single type of memory and it is not unusual for the memory subsystem to be built from a multitude of memory types. For example, there is often an extremely fast register based memory, a very fast cache memory, and at least one type of relatively fast random access memory (RAM) memory. Each type of memory can have a different access time, i.e., a time period required to read a data value from or write a data value to an address in the memory. The access time is typically defined as a time duration between initiation of the read or write access and when a result from the read or write access is valid. Should the system attempt to use the data before the access time expires, the data used may not be match up with what is actually in the memory and validity of the data is not ensured. The access time of a memory is often referred to as memory speed and a common way to describe the memory speed is to specify a number of wait-states required for memory access. A wait-state is a cycle of a clock driving the memory subsystem, a fast memory will have a small number of wait-states (or even zero wait-states), while a slow memory will have a large number of wait-states.

In the system with more than one type of memory, there must be some control logic to ensure that memory accesses to the different types of memories wait the required number of wait-states associated with each type of memory to ensure validity of the data. While it is certainly possible to wait the longest number of wait-states for every memory access, it is also the least efficient way to do so. In certain situations, the amount of logic required to support a memory subsystem with memories of varying speed can be crucial. For example, in a testing and emulating environment, additional logic must be kept to a minimum since any additional logic adds extra gates and devices that can themselves be faulty and cause functionality problems, i.e., the additional logic added to support the testing and emulating of the memory subsystem have themselves become faulty and cause the system to be faulty or at least appear to be faulty. Therefore, any additional logic must be minimized.

Some previous testing and emulating systems have had to include a separate set of logic for each type of memory in the system. This is inefficient and introduces a large amount of additional hardware. In an effort to minimize added logic, designers of other systems have chosen to simply test and emulate only one type of memory, such as the fast register memory or fast scratch RAM, e.g., portions of the memory subsystem lying within a microprocessor, and leave the responsibility of the testing and emulating of the remaining portions of the memory subsystem to the user. However, by moving the testing and emulating tasks squarely onto the shoulders of the user, the designers of the system are relying on the diligence of the user. This may result in the memory subsystems that are not fully tested. A need has therefore arisen for a testing and emulating system that can test and emulate all types of memories in the microprocessor based system and at the same time introduces a minimum amount of additional logic and complexity to the microprocessor based system.

SUMMARY OF THE INVENTION

In one aspect, the present invention provides an apparatus that supports testing and emulating a memory subsystem within a microprocessor based system comprising a data input for inputting data and memory addresses, a data output for outputting data, a programmable counter, a signal line, a program memory interface, and a test circuit. The test circuit further comprising an instruction register scan chain, at least one data register scan chain, and a finite state machine controlling the operation of the instruction register scan chain and the data register scan chains.

The present invention has a principal advantage in that it can support any arbitrary number of different memory speeds with a single set of logic, therefore greatly reducing the complexity of the apparatus. The minimal complexity of the invention and the fact that the complexity remains constant with the number of different memories supported allows the inclusion of the present invention into a design without significantly impacting the reliability or the overall size of the design itself.

An additional advantage of the present invention is its ability to support many different memory speeds, i.e., its great flexibility. This allows for a large amount of freedom in the application of the apparatus, permitting its installation in many different environments with minimal modifications to the apparatus' design.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

Figure 1:
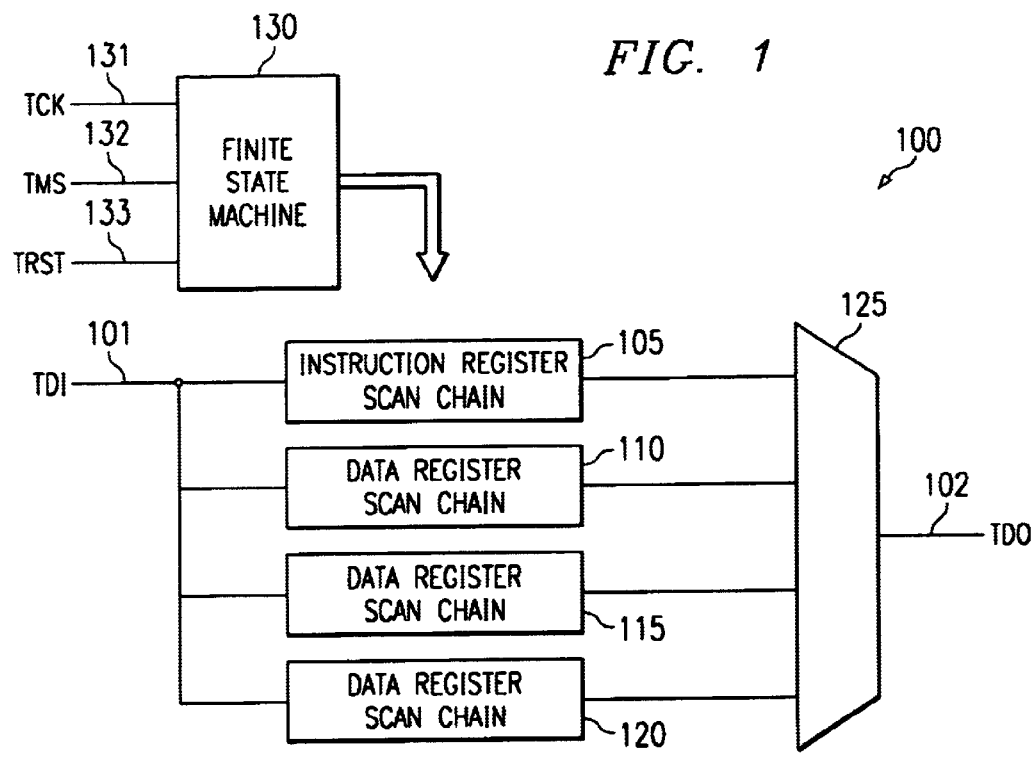
FIG. 1 illustrates a block diagram of a typical test circuit for support for testing and emulating.

FIG. 1 illustrates a schematic diagram of a test circuit 100 required to support testing and emulating. The test circuit 100 is representative of a standard design for test and emulation logic as specified by the IEEE technical standard 1149.1-1990. The test circuit 100 is comprised of a single instruction register scan chain 105 and at least one data register scan chain (FIG. 1 displays three, but there is no limit on the number of data register scan chains) 110, 115, and 120. Although displayed in FIG. 1 as three identical blocks, each of the data register scan chains may be of a different design and typically, they are different from one another. As specified in an Institute of Electrical and Electronics Engineers technical standard, "IEEE Standard Test Access Port and Boundary-Scan Architecture," standard number IEEE Std 1149.1-1990, which is incorporated herein by this reference, the instruction register scan chain and the data register scan chains 110, 115, and 120 are loaded with data in a serial fashion, but once loaded, they operate in a parallel manner. This hybrid serial and parallel behavior is to save on the number of input and output pins that need to be added to a system that is being supported by the test circuit 100.

A single test data input (TDI) pin 101 is used to input all instructions and data into the test circuit 100 and a single test data output (TDO) pin 102 is used to output data. In addition to the TDI and TDO pins, there are three other inputs pins specified for the test circuit 100. There is a test clock pin (TCK) 131, a test reset pin (TRST) 133, and a test mode select pin (TMS) 132. The TMS pin 132 is used to transition from one internal state of a finite state machine 130 to another internal state. The finite state machine 130 controls the operation of the test circuit 100 and its interaction with the system. The TCK pin 131 provides an external clock to clock the test circuit 100. The TRST pin 133 is used to perform a reset on the test circuit 100. The test circuit 100 as specified in the IEEE Std 1149.1-1990 technical standard is a synchronous circuit, meaning that the operation of the test circuit 100 occurs in lock-step with the external clock, the TCK pin 131. For example, transitions between internal states of the finite state machine 130 does not occur until the TMS pin 132 has a value asserted on it and a rising clock edge appears on the TCK pin 131, as per the IEEE Std 1149.1-1990. The IEEE Std 1149.1-1990 specifies a rising clock edge, however, a non-IEEE Std 1149.1-1990 compliant implementation of the test circuit 100 is free to use some is other event, such as a falling clock edge, to maintain synchronous operation. Outputs from the various register scan chains are multiplexed together and selected by a multiplexor 125 for output through the TDO pin 102. These pins are all that are required to support full test and emulation.

Figure 2:
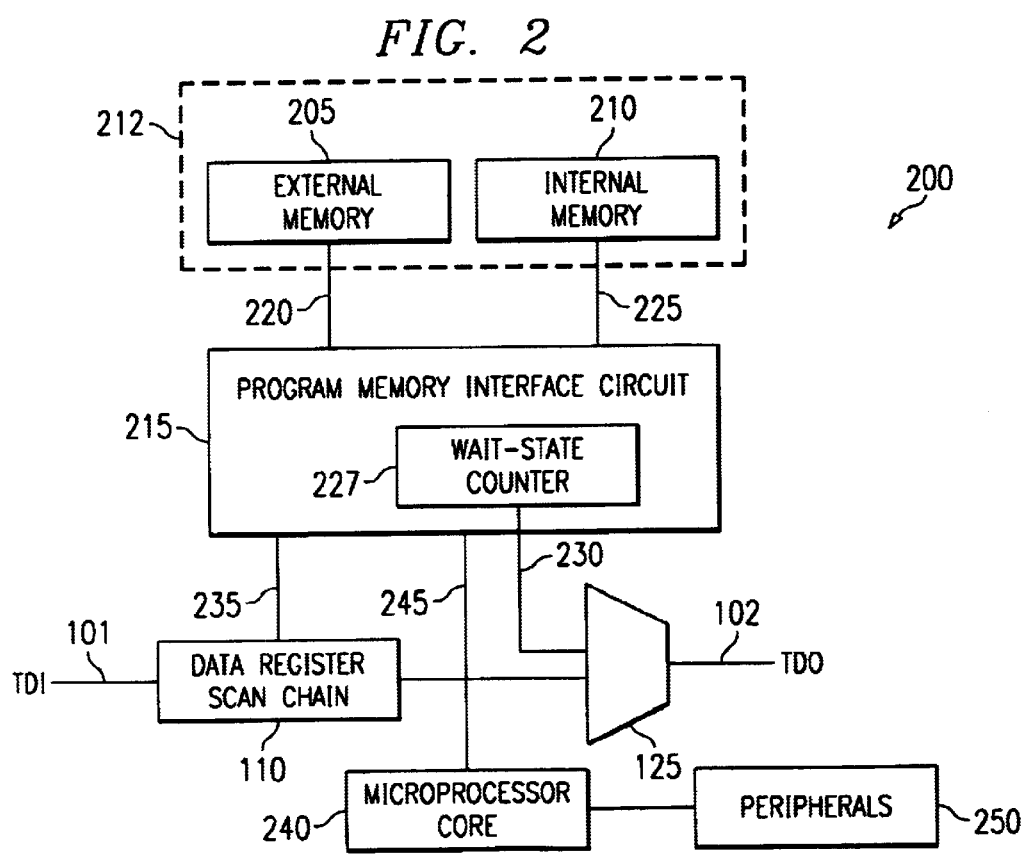
FIG. 2 is a schematic diagram of a microprocessor based system with built-in support for testing and emulating.

Referring now to FIG. 2 for a block diagram illustrating a typical microprocessor based system 200 with built-in support for testing and emulating. Portions of the test circuit 100 displayed in FIG. 1, namely, the finite state machine 130 and the instruction register scan chain 105 are not shown in the system 200 to maintain simplicity in FIG. 2, but would be present in an actual implementation of the system 200.

The system 200 contains an external memory block 205 and an internal memory block 210. Each memory block may in turn contain other blocks of memory, each possibly with a different access speed. The external memory block 205 and the internal memory block 210 are coupled to a program memory interface circuit (PMIC) 215 via memory buses 220 and 225. The external 205 and internal 210 memory blocks make up a memory subsystem 212. The memory subsystem 212 may have its own memory clock, which may operate at a clock frequency that is some multiple (including unity and fractions) of a system clock that drives the system 200. The PMIC 215 controls all access to the memory subsystem 212, including memory reads and writes. The PMIC 215 also performs memory mapping, a mapping operation in which memory addresses specified in the testing and emulating process are translated into physical memory locations. For example, a memory address of 1024 may actually map onto RAM bank number 2, word number 0.

In the preferred embodiment of the present invention, the PMIC 215 contains a programmable counter referred to as a wait-state counter 227. The wait-state counter 227 can be a simple binary counter that can either count down or up from a data value that is loaded into it and will begin its count as soon as it is told to do so by the PMIC 215. The wait-state counter 227 counts the cycles of the memory clock. Once the wait-state counter 227 reaches its terminating condition, which may include, but is not limited to, reaching zero or minus one or some other predetermined value, it will assert a true value on a wait-state counter underflow signal output line 230. The true value asserted on the wait-state counter underflow signal output line 230 signifies that the requisite number of cycles of the memory clock has elapsed since the initiation of the wait-state counter's 227 count.

The data register scan chain 110 is one data register scan chain selected from a plurality of data register scan chains (as illustrated in FIG. 1). The selected data register scan chain is determined by a test instruction loaded into the instruction register scan chain 105 (not shown in FIG. 2). Each data register scan chain can have a different design and for any given test instruction loaded into the instruction register scan chain 105, only one data register scan chain is selected. The presence of a plurality of data register scan chains in the test circuit 100 permits the use of different data register scan chains with different logical designs and modes of operation for supporting testing and emulating different portions of the system 200. The data register scan chain 110 is coupled to the PMIC 215 via a connector 235. The multiplexor 125 selectively couples the wait-state counter underflow signal output line 230 and the data register scan chain 110 to the TDO pin 102.

A microprocessor core 240 is coupled to both the PMIC 215 via a connector 245 and a peripherals controller 250 via a different connector 255. Since both the microprocessor core 240 and the data register scan chain 110 are connected to the PMIC 215 and there are common outputs of each, such as memory address, read and write (RAN) control, and R/W data, that connect to the PMIC 215, these outputs are selectively coupled together in order to reduce the total number of input/output connections on the PMIC 215. These multiplexors are not shown in FIG. 2, but are shown and discussed in FIG. 3. The peripherals controller 250 contains basic input and output logic and other control hardware to support various input and output devices and data peripherals that may be connected to the system 200.

Figure 3:
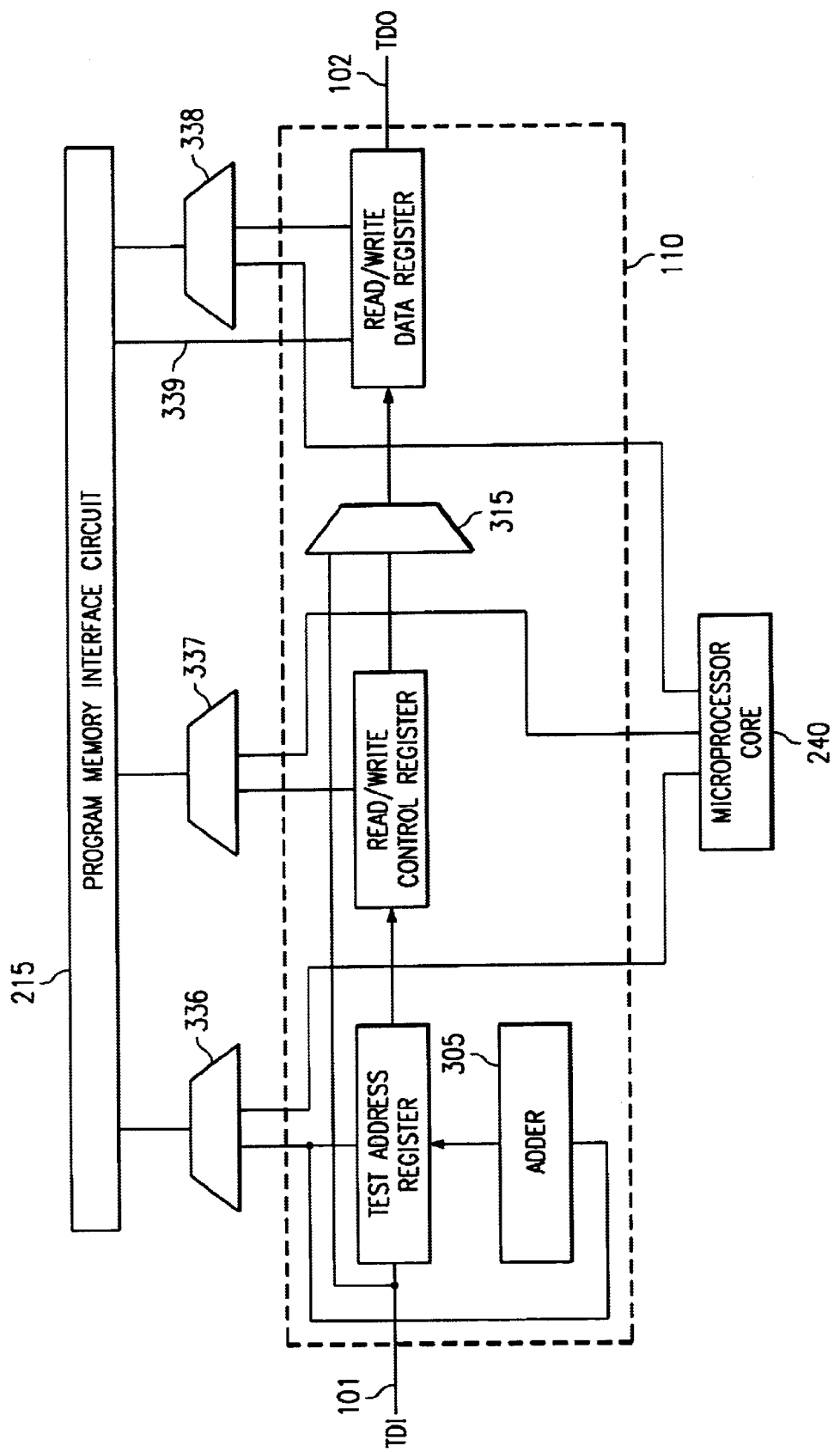
FIG. 3 is a detailed block diagram of the preferred embodiment of a data register scan chain shown in FIG. 2.

Referring now to FIG. 3 for a detailed block diagram of the preferred embodiment of the data register scan chain 110 shown in FIG. 2. A test address register 300 is coupled to the TDI pin 101. The test address register 300 contains an address of a memory location for testing. A multiplexor 336 selectively couples the test address register 300 to the PMIC 215 and allows the transfer of the address to the PMIC 215. Also connected to the test address register 300 is an adder 305. The adder 305 functions as an incrementer and automatically increments the address loaded into the test address register 300 by one after every memory access. Coupled to the test address register 300 is a R/W control register 310. The R/W control register 310 is a single bit control register that is also selectively coupled to the PMIC 215 via a multiplexor 337 and a value loaded into the R/W control register 310 specifies whether a memory access at the address loaded into the test address register 300 will be a memory read or a memory write.

A multiplexor 315 selectively couples the TDI pin 101 and the R/W control register 310 to a R/W data register 320. The multiplexor 315 permits data being shifted into the data register scan chain 110 from the TDI pin 101 to skip past the test address register 300 and the R/W control register 310 and directly enter the R/W data register 320. The purpose of the multiplexor 315 will be discussed in greater detail during the discussion of FIG. 4. The R/W data register 320 serves to contain data that is to be written to the address specified in the test address register 300 or data that is read from the address specified in the test address register 300, depending on the value written in the R/W control register 310. The R/W data register 320 is selectively coupled to the PMIC 215 via a multiplexor 338, permitting data to move from the R/W data register 320 to the PMIC 215. Another connection 339 permits data to move from the PMIC 215 to the R/W data register 320. The R/W data register 320 is selectively coupled to the TDO pin 102 by the multiplexor 125 (not shown in FIG. 3). The selective coupling between the R/W data register 320 and the TDO pin 102 permits outputting the data in the R/N data register 320 through the TDO pin 102 via serial shifting of the data for the purposes of examining and processing. The coupling between the R/W data register 320 and the TDO pin 102 actually permits the entire contents of the data register scan chain 110 to be shifted out serially should the need arise.

Figure 4:
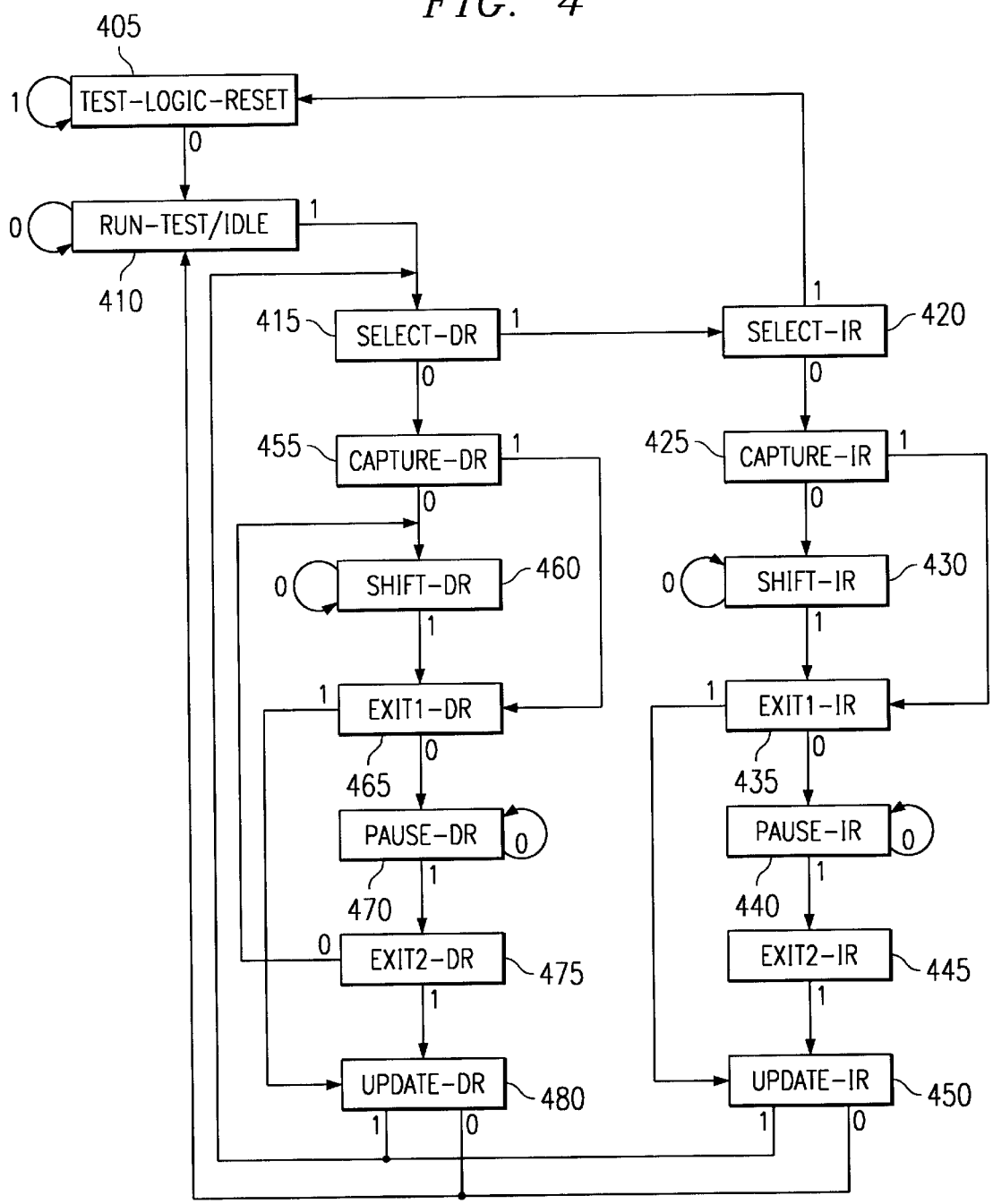
FIG. 4 is a state diagram of a finite state machine illustrating the operation of a system when operating in test and emulation mode.

Referring now to FIG. 4 for a state diagram 400 of the finite state machine 130 illustrating how the finite state machine 130 controls the operation of the test circuit 100 and the how the test circuit 100 interacts with the system 200 when operating in test and emulation mode. The state diagram 400 as displayed in FIG. 4 is specified in the IEEE 1149.1-1990 technical standard as FIG. 5.1 and is replicated herein. As previously discussed, the test circuit 100 is a synchronous circuit. However, in discussion of the state diagram below, state transitions are said to occur when a value is asserted onto the TMS pin 131. It is to be understood that the state transition does not actually occur until both a value is asserted onto the TMS pin 131 and a rising clock edge appears on the TCK pin 132. A person practiced in the art of the present invention will readily understand that the state machine 130 will not actually change states until a rising clock edge appears on the TCK pin 132.

The finite state machine 130 powers up and initializes into a TEST-LOGIC-RESET state 405. In the TEST-LOGIC-RESET state 405, the test circuit 100 is not active and the system 200 is permitted to operate in its normal mode. The finite state machine 130 will remain in this state until a zero value is asserted onto the TMS pin 132. If a zero value is asserted onto the TMS pin 132, the finite state machine 130 transitions to a RUN-TEST/IDLE state 410. In this state, the test circuit 100 remains idle and will stay in the RUN-TEST/IDLE state 410, but the microprocessor core 240 is locked to prevent changes from occurring and the test circuit 100 is now ready to commence operation. When a one value is asserted on the TMS pin 132, the finite state machine 130 will transition to a SELECT-DR state 415. The SELECT-DR state 415 is a temporary state where if a one value is asserted onto the TMS pin 132, then the finite state machine 130 transitions into a SELECT-IR state 420 and if a zero value is asserted onto the TMS pin 132, the finite state machine 130 transitions into a CAPTURE-DR 455 state and a data register scan chain 110 is selected. The data register scan chain 110 selected is one from the plurality of data register scan chains displayed in FIG. 1 and is uniquely specified by the instruction currently loaded in the instruction register scan chain 105. The data register scan chain 110 selected can and will change depending on the instruction loaded in the instruction register scan chain 105.

The SELECT-IR state 420 is a temporary state where if a one value is asserted onto the TMS pin 132, then the finite state machine 130 returns to the TEST-LOGIC-RESET state 405. If a zero value is asserted onto the TMS pin 132, then the finite state machine 130 will transition to a CAPTURE-IR state 425. This places the finite state machine 130 into a mode where it controls the operation of the instruction register scan chain 105. This mode is used to load an instruction into the instruction register scan chain 105. The operation of the test circuit 100 when the finite state machine 130 is in this mode is the same as detailed in the IEEE 1149.1-1990 technical standard and is not discussed here for the sake of brevity and simplicity.

When the finite state machine 130 is in the CAPTURE-DR state 455, the test circuit 100 permits parallel loading of data into the data register scan chain 110, however, in the preferred embodiment of the present invention, the CAPTURE-DR state 455 is an idle state. A zero value asserted onto the TMS pin 132 will cause the finite state machine 130 to transition into a SHIFT-DR state 460 while a one value asserted onto the TMS pin 132 will cause the finite state machine 130 to transition into an EXIT1-DR state 465 (another finite state machine 130 temporary state, the EXIT1-DR state 465 will be discussed in greater detail later). In the SHIFT-DR state 460, data is shifted into the data register scan chain 110 in serial fashion via the TDI pin 101. Depending on the desired operation (either read or write), different sets of data are shifted into the data register scan chain 110. If the desired operation is a read from a memory location, then the address of the memory location is shifted into the test address register 300, a Read value is shifted into the R/W control register 310, and nothing is shifted into the R/W data register 320. If the desired operation is a write to a memory location, then the address of the memory location is shifted into the test address register 300, a Write value is shifted into the R/W control register 310, and a data value to be written to the memory location is shifted into the R/W data register 320. The finite state machine 130 remains in the SHIFT-DR state 460 while the data is being shifted into the respective data registers. Once the shifting of the data is complete, a one value asserted onto the TMS pin 132 causes the finite state machine 130 to transition into the EXIT1-DR state 465.

The EXIT1-DR state 465 is a temporary state where a one value asserted onto the TMS pin 132 causes the finite state machine 130 to transition to an UPDATE-DR state 480 where the data shifted into the various data registers (the test address register 300, the R/W control register 310, and the R/W data register 320) remain unchanged. A zero value asserted to the TMS pin 132 while the finite state machine 130 is in the EXIT1-DR state 465 will result in a transition to a PAUSE-DR state 470. The PAUSE-DR state 470 is where the memory access is actually performed.

In the preferred embodiment of the present invention, when the finite state machine 130 is in the PAUSE-DR state 470, the test circuit 100 will perform the memory access specified by the data loaded into the data register scan chain 110. The test circuit 100 will initiate the memory access specified by passing the data loaded into the data register scan chain 110 to the PMIC 215 and asserting control lines to the PMIC 215. Upon detection of the control lines, the PMIC 215 performs the memory mapping operation on the address from the test address register 300. The memory mapping operation gives the PMIC 215 a physical memory address that is associated with the address in the test address register 300. Along with the physical memory address, the PMIC 215 will also obtain a speed rating on the speed of the physical memory containing the desired memory location. The speed rating for the memory maybe stored in a look-up table that lists all types of memory present in the system 200 or it maybe stored in a set of system registers that stores information about memory installed in the system 200. Typically, the speed rating will be a number of wait-states required for a memory access to the particular type of memory.

The PMIC 215 loads the number of wait-states into the wait-state counter 227 and tells the wait-state counter to begin counting. While the wait-state counter 227 performs its count, the finite state machine 130 transitions out of the PAUSE-DR state 470 and back into the PAUSE-DR state 470. The finite state machine 130 will continue to transition out of the PAUSE-DR state 470 and back into the PAUSE-DR state 470 until the wait-state counter 227 finishes counting. The finite state machine 130 is in effect "waiting" for the wait-state counter 227 to finish counting.

When the wait-state counter 227 finishes counting, i.e., it reaches a predetermined terminating condition, it asserts a true value onto the wait-state counter underflow signal output line 230. The true value on the wait-state counter underflow signal output line 230 signifies that a sufficient number of memory clock cycles have expired to ensure validity of the memory access and that the memory access is complete. While the finite state machine 130 is in the PAUSE-DR state 470, the true value on the wait-state counter underflow signal output line 230 propagates to the TDO pin 102 through multiplexor 125 to provide feedback to external emulation system that an access is complete.

The finite state machine 130 remains cycling through the PAUSE-DR state 470 until a one value is asserted onto the TMS pin 132. However, the one value will not be asserted onto the TMS pin 132 until after the true value has been asserted onto the wait-state counter underflow signal output line 230. The true value on the wait-state counter underflow signal output line 230 may be envisioned as a gate to the finite state machine's 130 transition out of the PAUSE-DR state 470. The transition out of the PAUSE-DR state 470 by placing a one value on the TMS pin 132 will not occur until the true value has been asserted onto the wait-state counter underflow signal output line 230 in the preferred embodiment of the present invention. If any data resulted from the memory access, it would be shifted out the TDO pin 132 at this time.

The memory mapping operation performed by the PMIC 215 and the loading of the number of wait-states associated with the desired memory location into the wait-state counter 227 allows the test circuit 100 to support any arbitrary number of different memory types and speeds with one set of logic. The preferred embodiment of the present invention has an additional advantage in that the logic has a complexity that does not change with the number and types of memories present in the system 200, only the size of the look-up table or system registers vary with the number and types of memories present.

Once the transition out of the PAUSE-DR state 470 occurs, the finite state machine enters an EXIT2-DR state 475, which causes the test address register 300 to load a next address from the adder 305 and the R/W data register 320 to load the data from the memory address through the connection 339 from the PMIC 215 in the case of a read access. If a one value is asserted onto the TMS line 132, the finite state machine 130 transitions into an UPDATE-DR state 480 where the data in the respective data registers remains unchanged. If a zero value is asserted onto the TMS line 132, the finite state machine transitions back to the SHIFT-DR state 460, and a new set of data is shifted into the data register scan chain 110. The transition back to state SHIFT-DR 460 is used in the test circuit 100 to support sequential memory accesses to a contiguous block of memory. The transition back to state SHIFT-DR 460 also permits the test circuit 100 to change its mode of operation.

The preferred embodiment of the present invention supports data register scan chains of variable length. For example, in a case when access to a contiguous block of memory is desired, it is inefficient to scan in a memory address for each memory location because it is known that the memory address of the current memory access is only one memory address different from the memory address of the previous memory access. In order to support access to a contiguous block of memory, a data register scan chain with two different lengths can be used to accelerate the testing and emulating of the contiguous memory block. The finite state machine 130 controlling the test circuit 100 remains as described previously, but modifications to the data register scan chain 110 facilitate different length scan chains. Memory accesses to the contiguous memory block can be divided into two types, an initial memory access and all subsequent memory access. A first data register scan chain, referred to as a long scan chain, is used with the initial memory access to initialize the address register scan chain 110 (selected when the finite state machine 130 is in state SHIFT-DR 460) by specifying a starting memory address, a memory access type (either a read or a write), and a data value if necessary (required only if the memory access type was a write access). After execution of the memory access initiated by the long scan chain (performed in finite state machine state PAUSE-DR 470), a second data register scan chain, referred to as a short scan chain, replaces the long scan chain (the replacement is implemented by the transition back to state SHIFT-DR 460 from the EXIT2-DR state 475). The replacement of the long scan chain with the sort scan chain is accomplished by bypassing the test address register 300 and the R/W control register 310. The short scan chain is shorter than the long scan chain due to the fact that the memory address and the memory access type is not shifted into their respective registers.

When using the short scan chain to access sequential memory locations in a contiguous block of memory, the adder 305 is used to automatically increment the memory address stored in the test address register 300. The auto increment and storage of the new memory address back into the test address register 300 occurs during the transition back to the SHIFT-DR state 460. By automatically incrementing the memory address, a new memory address does not need to be loaded sequentially into the test address register 300 for each subsequent memory address in the contiguous block of memory. This automatic incrementing of the memory address register 300 saves a significant amount of testing and emulating time since it negates the need to serially shift in a new memory address for every subsequent memory address in the contiguous block of memory. It should be evident to a person practiced in the art that the invention may be implemented using an auto decrement instead of the auto increment.

The need to shift in a R/W control bit for the R/W control register 310 is also eliminated by forcing all memory accesses to the contiguous block of memory to be consistent.

However, it is possible to permit a different memory access type for each memory access by simply moving the multiplexor 315 to a point after the test address register 300 and prior to the R/W control register 310 from its current location between the R/W control register 310 and the R/W data register 320. Only in the case when a memory write is being performed does any data need to be loaded into the R/W data register 320.

The short scan chain is comprised of the multiplexor 315 and the R/W data register 320. The multiplexor 315 selects the TDI pin 131 when the short scan chain is being used and the R/W control register 310 when the long scan chain is used. The presence of the multiplexor 315 permits the serial loading of the R/W data register 320 if memory writes are being performed. The finite state machine 130 states used for controlling the short scan chain are: SHIFT-DR 460 for shifting in a new data value if a memory write operation is being performed, EXIT1-DR 465, PAUSE-DR 470 for initializing and then remaining in PAUSE-DR 470 until the completion of the memory access, EXIT2-DR 475, and UPDATE-DR 480 once the memory accesses are complete.

After transitioning into the UPDATE-DR state 480, the finite state machine 130 can either return to the RUN-TEST/IDLE state 410 to facilitate selection of the data register scan chain to access another memory location or the SELECT-DR state to select the instruction register scan chain 105 to load in a new instruction or to return to the TEST-LOGIC-RESET state 405 to return the system 200 to normal operations.

As will be apparent from the above description, the preferred embodiments provide several advantageous features including a test and emulation system that supports any number and variety of memory, each with a different access speed, with a single set of test logic.

An additional advantage of the preferred embodiment is the complexity of the circuit supporting testing and emulation does not increase with a corresponding increase in the number and type of memory present in the system.

An additional advantage of the preferred embodiment is the use of different length scan chains permit optimized access to contiguous blocks of memory by removing the need to initialize every register in a data register scan path for each memory location.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus for providing multi-cycle memory access in a system with a microprocessor having a memory, said apparatus comprising:
   a test data input for inputting test instructions and data;
   a test data output for outputting data;
   a program memory interface circuit for controlling access to said microprocessor memory;
   a wait-state counter coupled to said program memory interface circuit for counting a number of wait-states elapsed since initiation of a memory access with a counting value loaded into said wait-state counter by said program memory interface circuit;
   a wait-state counter underflow signal output line from said wait-state counter and selectively coupled to said test data output for outputting completion of said wait-state counter's count, signifying completion of said memory access; and
   a scan boundary test circuit, said test circuit in turn comprising:
   an instruction register scan chain coupled to said test data input, said program memory interface circuit and selectively coupled to said test data output, said instruction register scan chain adapted to receive a test instruction and selecting a data register scan chain based on said test instruction; and
   at least one data register scan chain coupled to said test data input, said program memory interface circuit and selectively coupled to said test data output, said selected data register scan chain adapted to receive test data from said test data input, initiate said memory access, wait for assertion of said wait-state counter underflow signal output line, and output data from said memory access.

2. An apparatus according to claim 1 wherein said microprocessor memory is further comprised of a memory internal to said microprocessor and a memory external to said microprocessor.

3. An apparatus according to claim 1 wherein said microprocessor memory is further comprised of more than one type of memory, wherein each type of memory has a different access time.

4. An apparatus according to claim 1 wherein said wait-state counter is located outside said program memory interface circuit.

5. An apparatus according to claim 1 wherein said wait-state counter is loaded with a counting value stored in a look-up table.

6. An apparatus according to claim 1 wherein said scan boundary test circuit is a synchronous circuit.

7. An apparatus according to claim 1 wherein said counting value is different, depending upon the type of memory accessed.

8. An apparatus according to claim 1 wherein said wait-state counter counts downward from said counting value to zero.

9. An apparatus according to claim 1 wherein said wait-state counter counts downward from said counting value to negative one.

10. An apparatus according to claim 1 wherein said data register scan chain is further comprised of a test address register, a read and write (R/W) control register, and a R/W data register.

11. An apparatus according to claim 10 wherein said data register scan chain is further comprised of a short length scan chain used for sequential memory access to a contiguous block of memory and an accumulator adapted to automatically increment the test address register after every completed memory access.

12. An apparatus according to claim 1 wherein said data register scan chain is further comprised of variable length scan chains.

13. An apparatus according to claim 1 wherein said data register scan chain is further comprised of a long length scan chain used for single memory location accesses and initializing an initial memory access of a sequence of memory accesses for a contiguous block of memory.

14. An apparatus according to claim 1 wherein said test instructions and test data are input in serial fashion.

15. A microprocessor with integrated multi-cycle memory access support comprising:
   a test data input for inputting test instructions and data;

a test data output for outputting data;

a microprocessor core;

a microprocessor memory;

a program memory interface circuit for controlling access to said microprocessor memory;

a wait-state counter coupled to said program memory interface circuit for counting a number of wait-states expired since initiation of a memory access with a counting value loaded into said wait-state counter by said program memory interface circuit;

a wait-state counter underflow signal output line from said wait-state counter and selectively coupled said test data output for outputting completion of said wait-state counter's count, signifying completion of said memory access; and a scan boundary test circuit, said test circuit in turn comprising:

an instruction register scan chain coupled to said test data input, said microprocessor core, said program memory interface circuit and selectively coupled to said test data output, said instruction register scan chain adapted to receive a test instruction and selecting a data register scan chain based on said received test instruction; and at least one data register scan chain coupled to said test data input, said microprocessor core, said program memory interface circuit and selectively coupled to said test data output, said selected data register scan chain adapted to receive test data from said test data input, initiate said memory access, wait for assertion of said wait-state counter underflow signal output line, and output results from said memory access.

16. A method for providing multi-cycle memory access support in a microprocessor having a microprocessor core and a memory comprising the steps of:

locking the states of registers and flip-flops in said microprocessor core, preventing changes from occurring inside the microprocessor core;

loading a test instruction into an instruction register scan chain;

selecting a data register scan chain, wherein said data register scan chain is selected depending upon said test instruction that is loaded into said instruction register scan chain;

loading an address of a desired memory location into said data register scan chain;

initiating a desired memory access operation;

loading a counting value into a wait-state counter corresponding to a speed rating, associated with the desired memory location, required to access said desired memory location and initiating said wait-state counter;

asserting a wait-state underflow flag upon completion of said wait-state counter's count;

processing data from said desired memory access operation; and unlocking the states of registers and flip-flops in said microprocessor.

17. A method according to claim 16 further comprising the step of loading a Read value into a R/W control register for a read memory access.

18. A method according to claim 16 further comprising the step of loading a Write value into a R/W control register and a data value into a R/W data register for a write memory access.

* * * * *